US005325411A

United States Patent [19]

Orisaka

[11] Patent Number: 5,325,411

[45] Date of Patent: Jun. 28, 1994

[54] DISPLAY DRIVING CIRCUIT

[75] Inventor: Yukihisa Orisaka, Tenri, Japan

[73] Assignee: Sharp Kabushiki Kaisha, Osaka, Japan

[21] Appl. No.: 27,765

[22] Filed: Mar. 8, 1993

[30] Foreign Application Priority Data

May 29, 1992 [JP] Japan .................................. 4-139144

[51] Int. Cl.[5] ....................... H03K 21/02; H03K 21/08

[52] U.S. Cl. ......................................... 377/55; 377/54; 377/56

[58] Field of Search ............... 307/234, 262, 265, 269, 307/311, 518; 328/55; 377/20, 26, 28, 52, 70, 73, 78, 76, 107, 114, 56, 55, 54

[56] References Cited

U.S. PATENT DOCUMENTS 4,380,736 4/1983 Pfaff .................................... 307/269
4,777,385 10/1988 Hartmeier ............................. 328/55

FOREIGN PATENT DOCUMENTS 356992 3/1991 Japan .

*Primary Examiner*—Timothy P. Callahan
*Assistant Examiner*—Shawn Riley

[57] ABSTRACT

A display driving circuit includes a latch circuit provided with a resetting terminal for receiving a pulse signal having a constant period and a setting terminal, a logic product circuit for receiving an output signal of the latch circuit and the pulse signal, a counting circuit having a resetting terminal for receiving an output signal of the logic product circuit and a counting terminal for receiving a clock signal, the counting circuit outputting a data pulse every time a number of pulses of the clock signals reaches a preset constant value from a reception of the output signal of the logic product circuit; and a shift register for receiving the data pulse of the counting circuit at a data signal input terminal thereof and receiving the clock signal at a clock input terminal thereof, the latch circuit being adapted to receive the data pulse of the counting circuit at said setting terminal thereof.

3 Claims, 6 Drawing Sheets

DISPLAY DRIVING CIRCUIT

BACKGROUND OF THE INVENTION

1. Field of the Invention

The present invention relates to an electronic device such as a driving circuit for operating a display panel, etc.

2. Description of the Related Art

In a general driving circuit for operating a display panel, when plural chips of a register are longitudinally connected to each other and a first chip is newly operated by inputting a pulse to a latch circuit while second and subsequent chips are operated, no shift signal is yet outputted to an n-th chip at a final stage even when the latch circuit is reset by the pulse. Therefore, the latch circuit is again set when the shift signal n at the final stage is outputted. Accordingly, it is impossible to receive a pulse inputted when a chip outputting order is set. Therefore, there is a problem that the pulse is alternately outputted from this chip. Accordingly, there is a case in which a problem about a panel display is caused in accordance with a using method of the chips.

In a technique similar to that of the present invention, the setting operation of an initial value of an output shift register and the supply of an internal shifting clock pulse are started in accordance with a starting signal. The supply of the shifting clock pulse is stopped by receiving a carry output from a final stage of this shift register. However, when the starting signal is again inputted to this shift register during an operation thereof, a controller section receives the carry output and the supply of the shifting clock pulse is stopped when an output of the operating shift register at a final stage thereof is transmitted in accordance with the starting signal previously inputted to the shift register. Accordingly, the second inputted starting signal is invalidated.

SUMMARY OF THE INVENTION

It is therefore an object of the present invention to provide a display driving circuit in which no problem about a panel display is caused in accordance with a using method of chips.

Another object of the present invention is to provide a display driving circuit in which there is no error in operation of the display driving circuit even when a starting signal is inputted to a shift register during an operation thereof.

The above objects can be achieved by a display driving circuit comprising a latch circuit provided with a resetting terminal for receiving a pulse signal having a constant period and a setting terminal, a logic product circuit for receiving an output signal of the latch circuit and the pulse signal, a counting circuit having a resetting terminal for receiving an output signal of the logic product circuit and a counting terminal for receiving a clock signal, the counting circuit outputting a data pulse every time a number of pulses of the clock signals reaches a preset constant value from a reception of the output signal of the logic product circuit; and a shift register for receiving the data pulse of the counting circuit at a data signal input terminal thereof and receiving the clock signal at a clock input terminal thereof, the latch circuit being adapted to receive the data pulse of the counting circuit at said setting terminal thereof.

In the above display driving circuit of the present invention, the latch circuit is reset by a starting pulse signal and the counting circuit is reset by an output signal of a logic product of an output signal of the latch circuit and the starting pulse signal. After the counting circuit is initialized by its resetting operation, the counting circuit counts the number of clock signals and outputs a data pulse signal when the number of clock signals reaches a preset constant value. The data pulse signal is set to an input signal of a shift register and is used as a setting signal of the latch circuit.

An output signal of the latch circuit is held until the output of the data pulse signal of the counting circuit from the input of the starting pulse signal. A resetting operation of the counting circuit is controlled by the output signal of the latch circuit.

In accordance with the above structure of the display driving circuit, no problem about a panel display is caused in accordance with a using method of chips. Further, there is no error in operation of the display driving circuit even when the starting signal is inputted to the shift register during an operation thereof.

Further objects and advantages of the present invention will be apparent from the following description of the preferred embodiments of the present invention as illustrated in the accompanying drawings.

DESCRIPTION OF THE PREFERRED EMBODIMENTS

The preferred embodiments of a display driving circuit in the present invention will next be described in detail with reference to the accompanying drawings.

Figure 1:
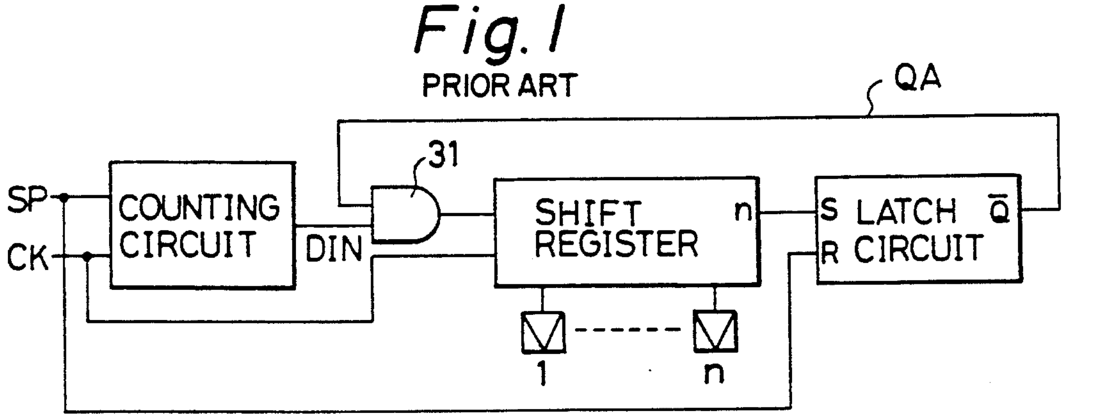
Fig. 1 PRIOR ART
FIG. 1 is a circuit diagram showing an example of a general display driving circuit.
Figure 2:
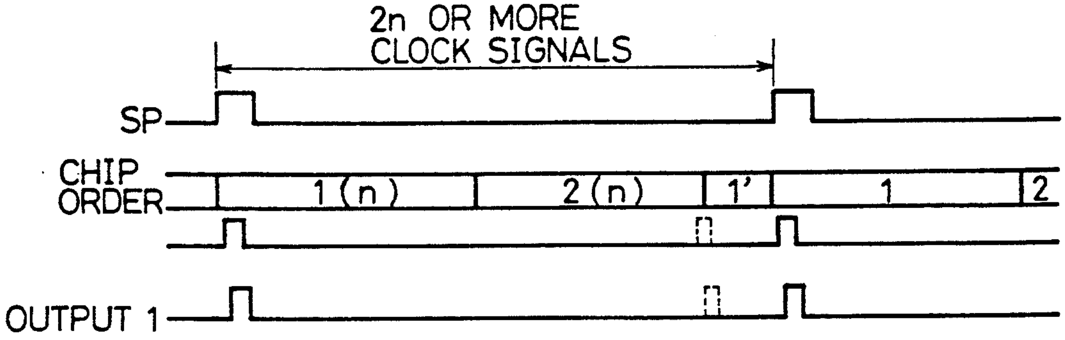
Fig. 2 PRIOR ART
FIG. 2 is a first timing chart showing timings of signals of the driving circuit shown in FIG. 1.
Figure 3:
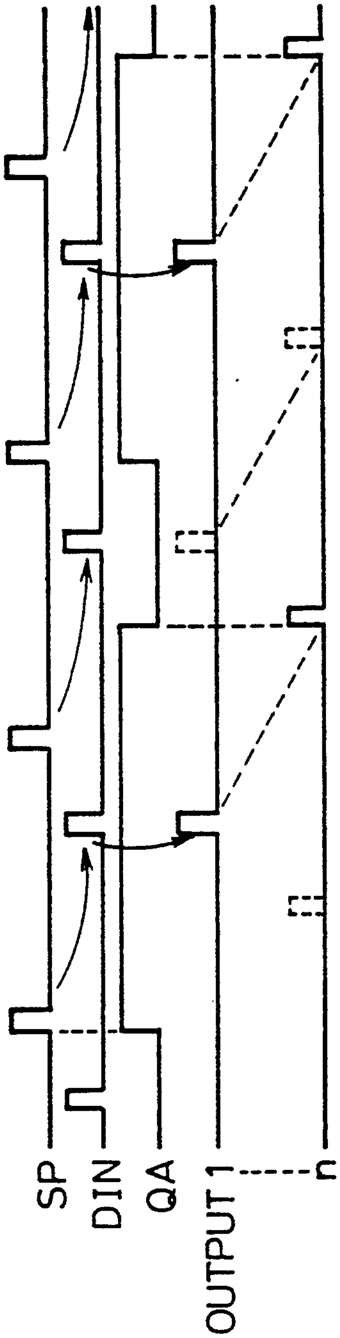
Fig. 3 PRIOR ART
FIG. 3 is a second timing chart showing timings of signals of the driving circuit shown in FIG. 1.

FIG. 1 shows a driving circuit for operating a display panel based on a general technique. FIGS. 2 and 3 show timings of signals of this driving circuit. In a construction of the general display driving circuit shown in FIG. 1, when plural chips of a register are longitudinally connected to each other and are used, a logic product of a data pulse signal DIN outputted from a counting circuit and an output signal QA of a latch circuit is inputted to a shift register as a data input when a chip outputting order is set. When the output of a final chip is completed, the latch circuit is set and not operated until the latch circuit is reset by the next starting pulse signal SP. As shown in FIG. 2, when two chips each requiring n-clock signals are longitudinally connected to each other to transmit all outputs of the latch circuit and an interval between pulse signals SP is set by the number 2$n$ of clock signals or more, a latched output signal is again inputted to the shift register as the data pulse signal DIN so as to prevent the output of error data.

However, as shown in FIG. 3, when the plural chips are longitudinally connected to each other and a first chip is newly operated by inputting a pulse SP to the latch circuit while second and subsequent chips are operated, no shift signal is yet outputted to an n-th chip at a final stage even when the latch circuit is reset by the pulse SP. Therefore, the latch circuit is again set when the shift signal n at the final stage is outputted. Accordingly, it is impossible to receive a pulse DIN inputted when a chip outputting order is set. Therefore, there is a problem that the pulse SP is alternately outputted from this chip. Accordingly, there is a case in which a problem about a panel display is caused in accordance with a using method of the chips.

Figure 4:
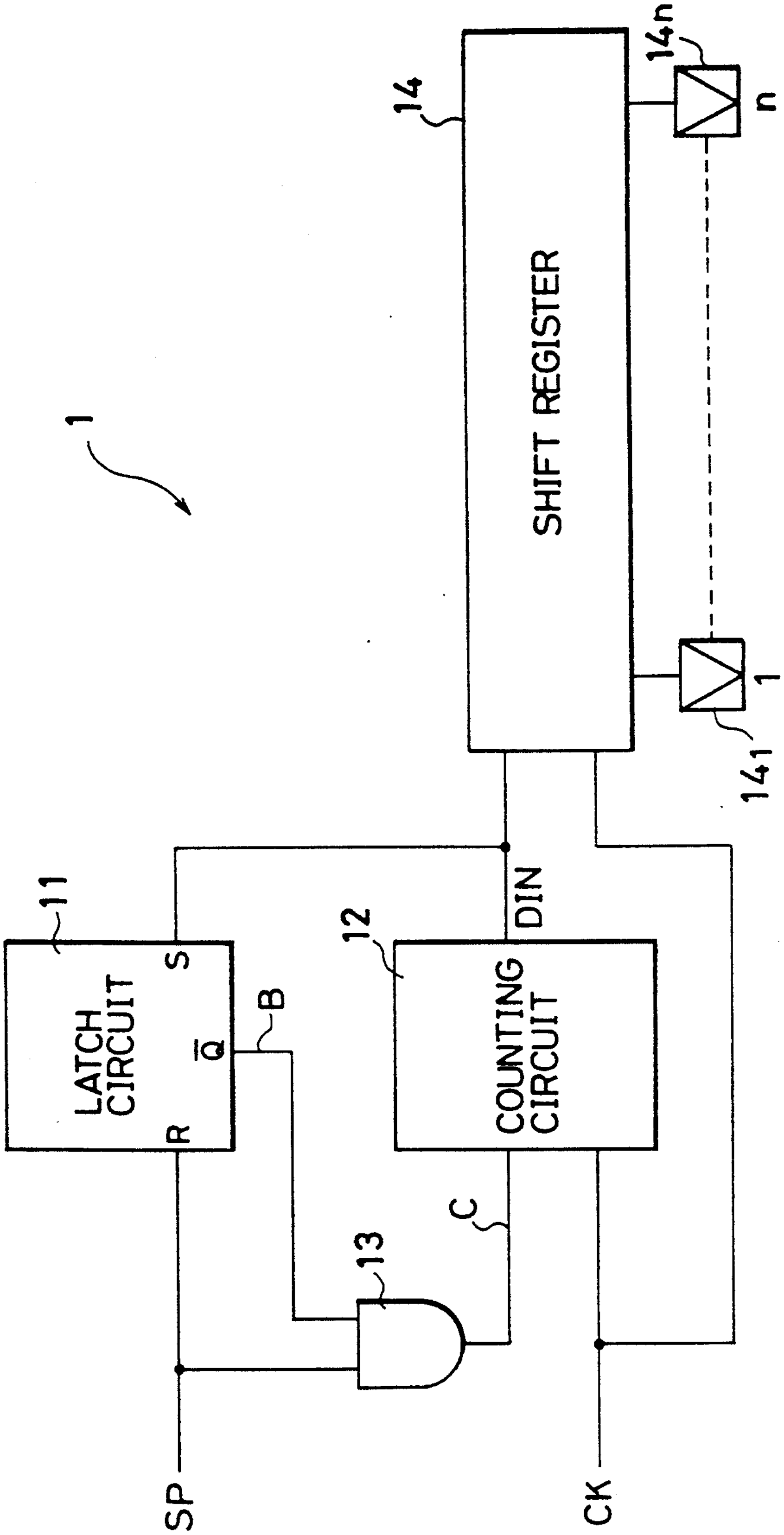
FIG. 4 is a circuit diagram showing a display driving circuit in accordance with one embodiment of the present invention.

FIG. 4 is a circuit diagram showing a display driving circuit in accordance with one embodiment of the present invention. The display driving circuit shown in FIG. 4 is constructed by a latch circuit 11, a counting circuit 12, an AND circuit 13, a shift register 14 and output terminals $\mathbf{14}_l$ to $\mathbf{14}_n$.

A starting pulse SP is inputted to the latch circuit 11 and the AND circuit 13. The starting pulse SP and a low active output signal B of the latch circuit are set to input signals of the AND circuit 13. An output signal C of the AND circuit 13 is inputted to the counting circuit 12 to initialize this counting circuit 12. A clock signal CK is inputted to the counting circuit 12 and the shift register 14 which are operated in synchronization with the clock signal CK. The counting circuit 12 is an internal counting circuit when chips are longitudinally connected to each other. The number of clock signals CK is counted with a voltage of the output signal C at an inputting time thereof as an initial value. When the number of clock signals CK reaches a preset counting number, the counting circuit 12 outputs a data pulse DIN. The data pulse DIN outputted from the counting circuit 12 is inputted to the shift register 14. Shift signals are sequentially outputted to the output terminals $\mathbf{14}_l$ to $\mathbf{14}_n$ in synchronization with the clock signals CK.

The latch circuit 11 is reset by a starting pulse SP and is set by the data pulse DIN as an output signal of the counting circuit 12. The output signal B of the latch circuit 11 and the starting pulse SP are set to input signals of the AND circuit 13. The output signal C of the AND circuit 13 is set to a resetting signal of the counting circuit 12.

For example, when two chips 1 are longitudinally connected to each other and a second chip of these chips is represented in the display driving circuit shown in FIG. 4, a predetermined numeric value is set to a counting number in the chips 1. This predetermined numeric value is set such that shift signals of the first and second chips are continuosly outputted. With respect to the second chip 2, after a starting pulse SP is inputted to the counting circuit 12 in accordance with this counting number, the counting circuit 12 counts the number of clock signals CK. When the number of clock signals reaches a predetermined number, a data pulse signal DIN is outputted from the counting circuit 12 so that a shift signal is outputted to each of the output terminals $\mathbf{14}_1$ to $\mathbf{14}_n$.

Figure 5:
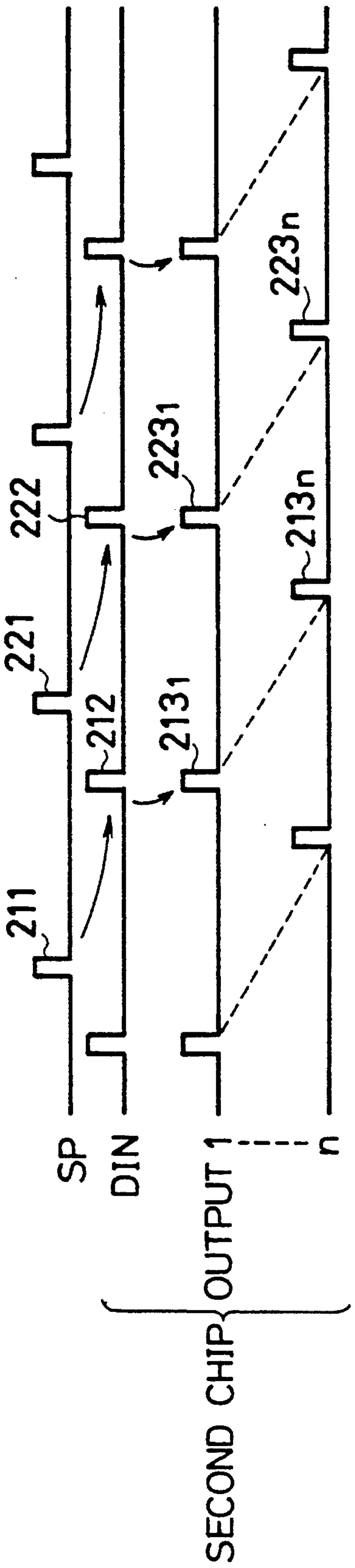
FIG. 5 is a timing chart showing timings of signals of the display driving circuit shown in FIG. 4.

FIG. 5 illustrates timing of this data pulse signal DIN. After a starting pulse SP211 is inputted to the counting circuit 12, the counting circuit 12 counts the number of clock signals CK. When the number of clock signals CK reaches a predetermined number, the counting circuit 12 outputs the data pulse DIN. After the data pulse DIN is inputted to the shift register 14, shift signals $\mathbf{213}_1$ to $\mathbf{213}_n$ are sequentially outputted from the shift register 14. A shift signal of the first chip is outputted between the starting pulse SP211 and the data pulse DIN.

A second starting pulse is inputted to the counting circuit 12 while the shift signals $\mathbf{213}_1$ to $\mathbf{213}_n$ are outputted, thereby starting the next shifting operation.

Thus, a displaying operation can be normally performed even when the number of lines of a display panel is smaller than the number n of outputs of the chips 1. For example, when the number n of chips is set to 120 and the number of lines of the display panel is set to 400, it is necessary to set four longitudinal connections of the chips 1 so that a total number of outputs of the chips is set to 480. The starting pulse SP is inputted to the counting circuit when 400 outputs are transmitted from the chips in the operation of the display driving circuit. However, in this case, the displaying operation can be normally performed in accordance with the display driving circuit in this embodiment. The normal displaying operation can be similarly performed even when two, three, —, or m chips are longitudinally connected to each other. Further, since the above latch circuit is disposed, no display driving circuit is operated in error even when an interval of the starting pulse SP is set by the number $2n$ of clock signals or more as shown in FIG. 3.

Figure 6:
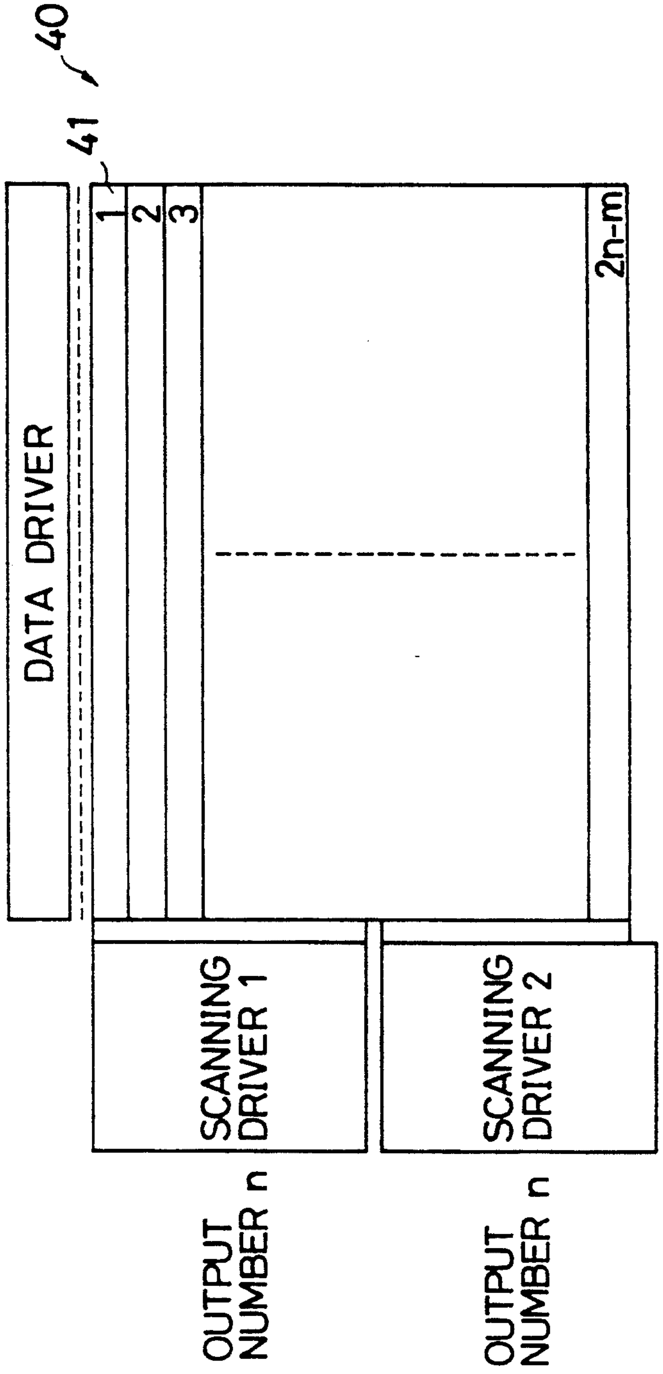
FIG. 6 is a display driving circuit of the present invention used in a scanning driver of a liquid crystal panel.
Figure 7:
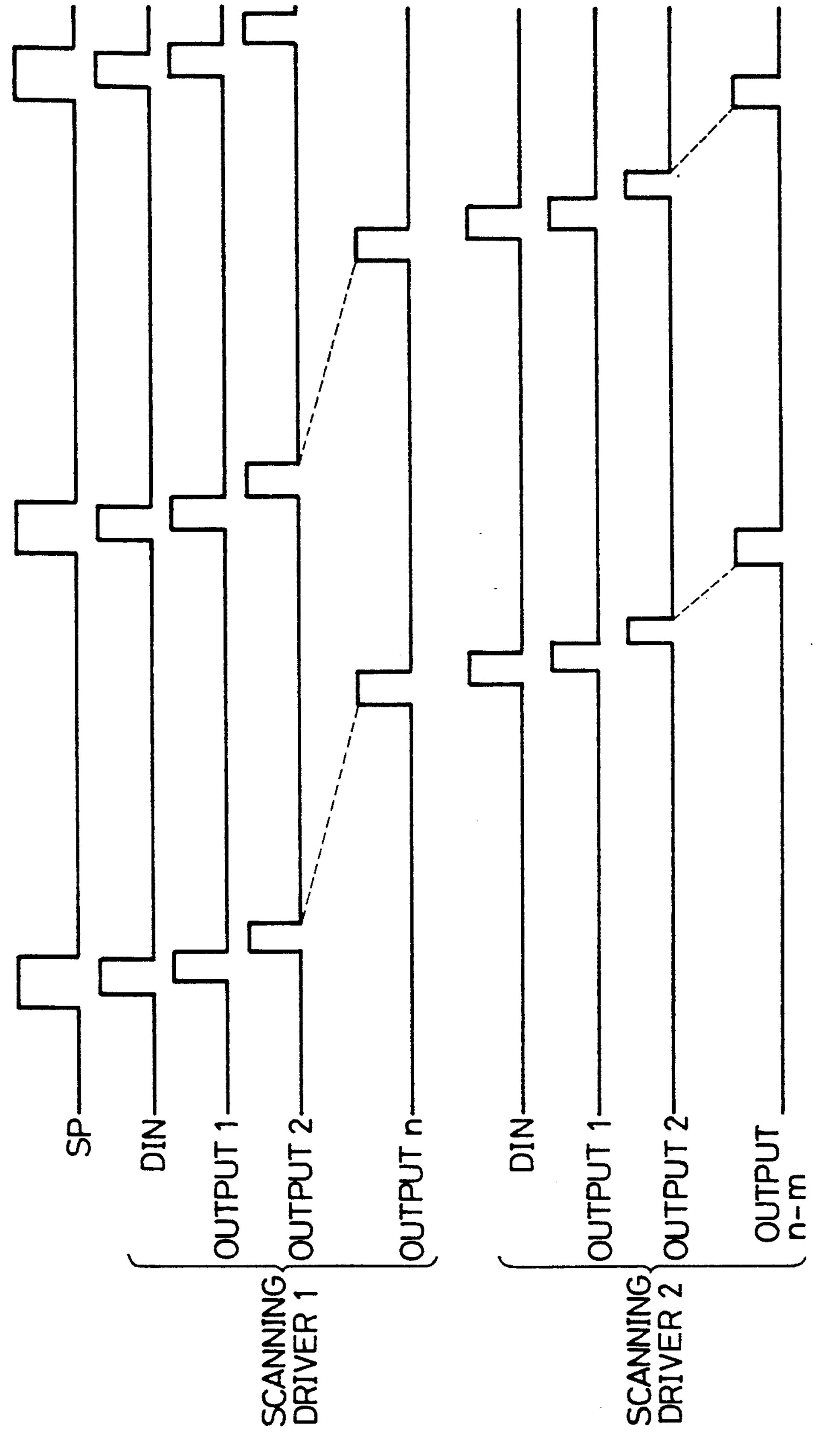
FIG. 7 is a timing chart showing timings of signals of the display driving circuit shown in FIG. 6.

FIG. 6 shows a display driving circuit used in a scanning driver of a liquid crystal panel in accordance with another embodiment of the present invention. In FIG. 6, the number of outputs of the scanning driver is set to n and the number of scanning lines 41 of the liquid crystal panel 40 is set to $2n-m$. Further, the number of scanning lines 41 of the liquid crystal panel 40 is set to be smaller than the number of outputs of the scanning driver. As shown by a timing chart in FIG. 7, when an operation of the scanning driver is started, a starting pulse SP is inputted to the scanning driver. In the case of a scanning driver 1, a data pulse DIN is outputted to a shift register by the operation of a counting circuit.

The liquid crystal panel 40 is operated on a first line thereof by a scanning signal of a first output of the scanning driver. In the meanwhile, a video signal is written onto the first line of the liquid crystal panel 40 by the operation of a data driver. Data pulses are sequentially outputted to the shift register on second and subsequent lines of the liquid crystal panel 40. In the case of a scanning driver 2, the counting circuit is set such that shift signals of the scanning drivers 1 and 2 are continuously outputted by the counting circuit after the starting pulse SP is inputted to this scanning driver 2. A predetermined data pulse DIN is outputted to the shift register by this counting circuit. Thus, the liquid crystal panel 40 is continuously operated on (n+1)-th and subsequent scanning lines thereof. The operation of the scanning driver 1 must be started by inputting the next starting pulse to the scanning driver 1 during the outputting operation of the scanning driver 2 so as to continuously output the next picture when the liquid crystal panel 40 is operated until $(2n-m)$-th scanning line. At this time, it is possible to cope with this situation without any error in operation of the display driving circuit of the present invention.

As mentioned above, in the display driving circuit of the present invention, the setting operation of a latch circuit for preventing an error in operation of the display driving circuit is controlled by a data pulse output signal of a counting circuit. Accordingly, when a plurality of chips are longitudinally connected to each other, a target operation of the display driving operation can be performed even when the next starting pulse SP is inputted to the counting circuit while the outputs of second and subsequent chips are transmitted from the counting circuit. Thus, the display driving circuit can be operated without any influence on function when the number of lines of a display panel is smaller than the number of outputs of chips and the starting pulse SP must be inputted to the counting circuit while the chips are operated.

Many widely different embodiments of the present invention may be constructed without departing from the spirit and scope of the present invention. It should be understood that the present invention is not limited to the specific embodiments described in the specification, except as defined in the appended claims.

What is claimed is:

1. A display driving circuit comprising:

a latch circuit provided with a resetting terminal for receiving a pulse signal having a constant period and a setting terminal;

a logic product circuit for receiving an output signal of said latch circuit and the pulse signal;

a counting circuit having a resetting terminal for receiving an output signal of said logic product circuit and a counting terminal for receiving a clock signal, said counting circuit outputting a data pulse every time a number of pulses of the clock signals reaches a preset constant value from a reception of the output signal of said logic product circuit; and a shift register for receiving the data pulse of said counting circuit at a data signal input terminal thereof and receiving the clock signal at a clock input terminal thereof, said latch circuit being adapted to receive the data pulse of said counting circuit at said setting terminal thereof.

2. A display driving circuit as claimed in claim 1, wherein a resetting operation of said counting circuit is controlled by the output signal of said latch circuit.

3. A display driving circuit as claimed in claim 1 or 2, wherein a setting operation of said latch circuit is controlled by the data pulse of said counting circuit.

* * * * *